United States Patent
Yamanashi et al.

(10) Patent No.: US 6,454,582 B2
(45) Date of Patent: Sep. 24, 2002

(54) WIRING UNIT

(75) Inventors: Makoto Yamanashi; Hiroyuki Suzuki; Takao Murakami, all of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/897,047

(22) Filed: Jul. 3, 2001

(30) Foreign Application Priority Data

Jul. 19, 2000 (JP) ........................................ 2000-218946

(51) Int. Cl.$^7$ ................................................ H01R 29/00
(52) U.S. Cl. ........................................ 439/189; 439/66
(58) Field of Search ........................... 439/45–49, 188, 439/189, 425, 426, 511

(56) References Cited

U.S. PATENT DOCUMENTS

| | | | |
|---|---|---|---|
| 5,040,996 A | * | 8/1991 | Kobold ........................ 439/76 |
| 5,290,970 A | * | 3/1994 | Currie |
| 5,975,913 A | * | 11/1999 | Wada et al. .................... 439/55 |
| 6,049,039 A | * | 4/2000 | Fushimi ..................... 439/46 K |

* cited by examiner

*Primary Examiner*—Khiem Nguyen
(74) *Attorney, Agent, or Firm*—Armstrong, Westerman & Hattori, LLP

(57) ABSTRACT

A wiring unit 1 is housed in a case of an electric connecting box. The wiring unit includes a plurality of flat circuit bodies each composed of an insulating plate 21 and a plurality of bus bars 22 extended in parallel, and a short-circuiting member 23 composed of a pair of pin segments 24 and a coupling segment 25 for coupling them. The short-circuiting member 23 is formed in a ⊐-shape. The pin segments 24 are stuck into the bus bars so that the bus bars 22 are electrically connected to each other. In this configuration, the wiring unit can be manufactured at low cost and can be downsized.

4 Claims, 4 Drawing Sheets

WIRING UNIT

BACKGROUND OF THE INVENTION

1. Field of the Invention

This invention relates to a wiring unit housed in an electric connecting box mounted in a motor vehicle that is a moving body.

2. Description of the Related Art

The motor vehicle is generally provided with a variety of electronic appliances inclusive of lamps such as a head lamp, tail lamp, etc. motors such as a starter motor, a motor for an air conditioner, etc.

In order to supply power to the variety of electronic appliances, junction blocks are located at suitable position within the motor vehicle. The junction block is configured so that printed boards and wiring boards with elements such as bus bars are stacked and various electric circuit units such as a large number of fuses, relays, etc. are integrated on these wiring boards.

The junction block may include a fuse, relay, bus bar, etc. so that it is called a fuse block, relay box, or generally an electric connecting box. In this specification, the above fuse block, relay box, junction block, etc, are referred to as the electric connecting box.

The electric connecting box includes a case and a wiring plate, etc. The case can be provided with electric components such as a relay, fuse, connector. A plurality of electric wires connected to the various electric appliances are led into the case. The wiring plate, when it is housed in the case, electrically connects the electric wires connected to the various electric appliances to terminals of the various electric components in a prescribed pattern.

As the above wiring plate, in order to facilitate the connection of the respective electric wires to the terminals of the electric components, a wiring unit 54 as shown in FIG. 6 has been proposed. The wiring unit as shown in FIG. 6 includes a plurality of boards 61 which are stacked successively, a plurality of terminals 62 and a plurality of connecting bars 63. The boards 61 each is made of an insulating material. The boards 61 each is formed as a square flat plate. The boards 61 each includes a plurality of grooves 64, a plurality of concave portions 65 and a plurality of holes 66.

The grooves 64 each is formed in concave from the surface of the board 61. The grooves 64 each extends in a longitudinal direction of the board 61. The respective grooves 64 are formed in parallel to one another.

The concave portions 65 each is formed in concave from the surface of the board 61. The concave portions 65 each is opened into the groove 64. The concave portions 65 are provided in parallel to one another in the longitudinal direction of the corresponding groove 64. The concave portions 65 each is formed in a square shape when viewed from above.

The holes 66 each passes through the portion located at the bottom of the corresponding concave portion 65. The holes 66 are located at the corresponding positions when the boards are stacked successively.

The terminals 62 each is made from a metallic sheet. The terminal 62 is composed of an electric contact portion 67 and an electric-wire connecting portion 68. The electric contact portion 67 is adapted to receive in the above connecting bar 63. When the connecting bar 63 is received in the electric contact portion 67, it produces elastic restitutive force that impedes the insertion of the connecting bar 63 so that the relative position of the connecting bar 63 to the electric contact portion 67 is maintained.

The electric-wire connecting portion 68 permits an electric wire to be arranged unidirectionally. The electric-wire connecting portion 68 includes a crimping segment 70 on which the electric wire 69 can be crimped and a pair of electric-wire holding segments 71 which are located at the positions where the electric wire 69 is sandwiched in the direction of arranging the electric wire 69.

The crimping segment 70 is provided with two pairs of press-fitting blades 72, which cut the coating of the electric wire 69 to come in contact with the core thereof. The electric wire holding portions 71 each is provided with a pair of caulking pieces 73 between which the electric wire 69 with the coating is caulked. The caulking pieces 73 sandwiches the electric wire 69 therebetween so that the contact state of the press-fitting blades 72 of the crimping portion 70 and the core is maintained.

The electric contact portion 67 and the electric-wire connecting portion 68 are arranged at the positions where the electric wire 69 is not impeded. Specifically, in the direction of arranging the electric wire 69, the electric connecting portion 67 is arranged to intersect the electric-wire connecting portions 68.

The terminal 62 connects the electric wire 69 crimped on the crimping portion 70 or electric-wire connecting portion 68 and the connecting bar 63 inserted into the electric contact portion 67 to each other. The terminal 62 is attached to the board 61 in a state where the electric contact portion 67 is housed in the concave portion 65 and the electric connecting portion 68 is housed in the groove 64.

The connecting bar 63 is made of a conductive material. The connecting bar 63 is formed in a band shape. The connecting bar 63, when inserted into the hole 66 and the electric connecting portion 67 of the terminal 62, is electrically connected to the electric wire 69.

In the wiring unit having the configuration described above, the electric wires 69 connected to various electric appliances are arranged in the grooves 64. By stacking a plurality of boards 61 and optionally selecting the concave portions 65 and holes 66, the electric wires 69 are electrically connected to the relay, fuse, connector, etc. mounted in the above case according to a prescribed pattern.

In the wiring unit 54 shown in FIG. 6, since the grooves 64 and concave portions 65 are formed in the insulating plate 61, relatively complicated inequalities must be formed in the surface of the insulating plate 61. This requires the complicate shape of the mold which is used to shape the insulating plate 61, thus increasing the production cost.

In the wiring unit 54, in assembling, after the terminals 62 have been attached for each insulating plate 61, the electric wires 69 must be crimped. This may increase the number of man-hours for assembling and hence steep rise in the production cost.

The circuit configuration of the wiring unit 54 is composed of the electric wires 69 and terminals 62 arranged along each groove 64 and the respective connecting bars 63 inserted in the electric contact portions 67. In this way, the circuit configuration is composed of the electric wires and terminals 62 which are superposed on one another in a direction of stacking the insulating plates 61. This increases the limitation to circuit design and upsizes the wiring unit 54.

SUMMARY OF THE INVENTION

Therefore, an object of this invention is to provide a wiring unit which can be manufactured at low cost and downsized.

In order to attain the above object, in accordance with this invention, there is provided a wiring unit comprising:

a plurality of flat circuit bodies each composed of an insulating plate and a plurality of conductors arranged thereon in parallel in a direction thereof, the circuit bodies being stacked successively vertically; and a short-circuiting member composed of a plurality of pin segments and a coupling segment for electrically coupling the plurality of pin segments with each other, the short-circuiting member being made of a conductive material and covered with an insulating film on its surface, wherein the pin segments with the insulating film partially removed are stuck into the flat circuit bodies so that the conductors are electrically connected to each other.

In this configuration, by selecting the conductors into which the pin segments of the short-circuiting member are stuck, the desired conductors can be electrically connected to each other surely in accordance with a prescribed pattern. In this way, the simple configuration of sticking the pin segments of the short-circuiting member can assure a desired electric connection. This reduces the number of man-hours for production of the components and for assembling, thereby suppressing a rise in production cost.

Further, the short-circuiting member has a plurality of pin segments so that the conductors arranged in parallel can be electrically connected to each other surely. This suppresses the limitation to the circuit design of the wiring unit and miniaturizes it.

In a preferred embodiment, the short-circuiting member is formed in a ⊐-shape with a pair of pin segments, and the interval between the pin segments is smaller than that between inner edges of the conductors adjacent to each other and larger than that between outer edges of the conductors adjacent to each other. Because of this arrangement, the conductors adjacent to each other can be electrically connected to each other surely by the short-circuiting member in accordance with the prescribed pattern.

In a further preferred embodiment, at least one of the conductors of at least one of the flat circuit bodies protrudes from its end to form a male tab which can be connected to an electric wire electrically connected to anexternal appliance. Because of such a configuration, an electric connection can be surely made between the conductors connected to each other and the external appliance in accordance with a desired pattern.

The above and other objects and features of this invention will be more apparent from the following description taken in conjunction with the accompanying drawings.

DESCRIPTION OF THE PREFERRED EMBODIMENT

Referring to FIGS. 1 to 4, an explanation will be given of a wiring unit according to an embodiment of this invention.

As seen from FIGS. 1 to 4, in accordance with a prescribed pattern, the wiring unit 1 electrically connects a plurality of electric wires 16 (FIGS. 1, 4), which are housed within the electric connecting box attached to the moving body such as a motor vehicle and connected to various electric appliances and power sources arranged in the motor vehicle, to electric components such as a relay, fuse and connector in the electric connecting box.

Figure 1:
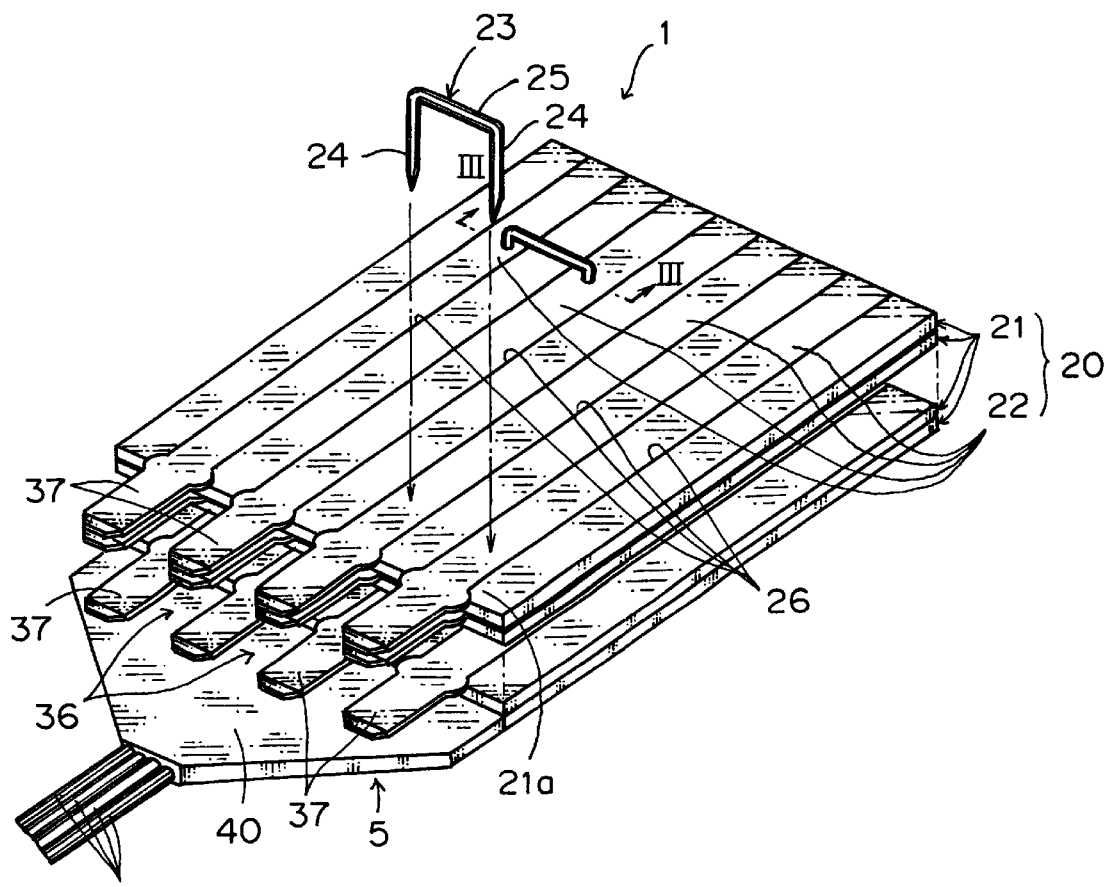
FIG. 1 is a perspective view of a wiring unit according to an embodiment of this invention.
Figure 4:
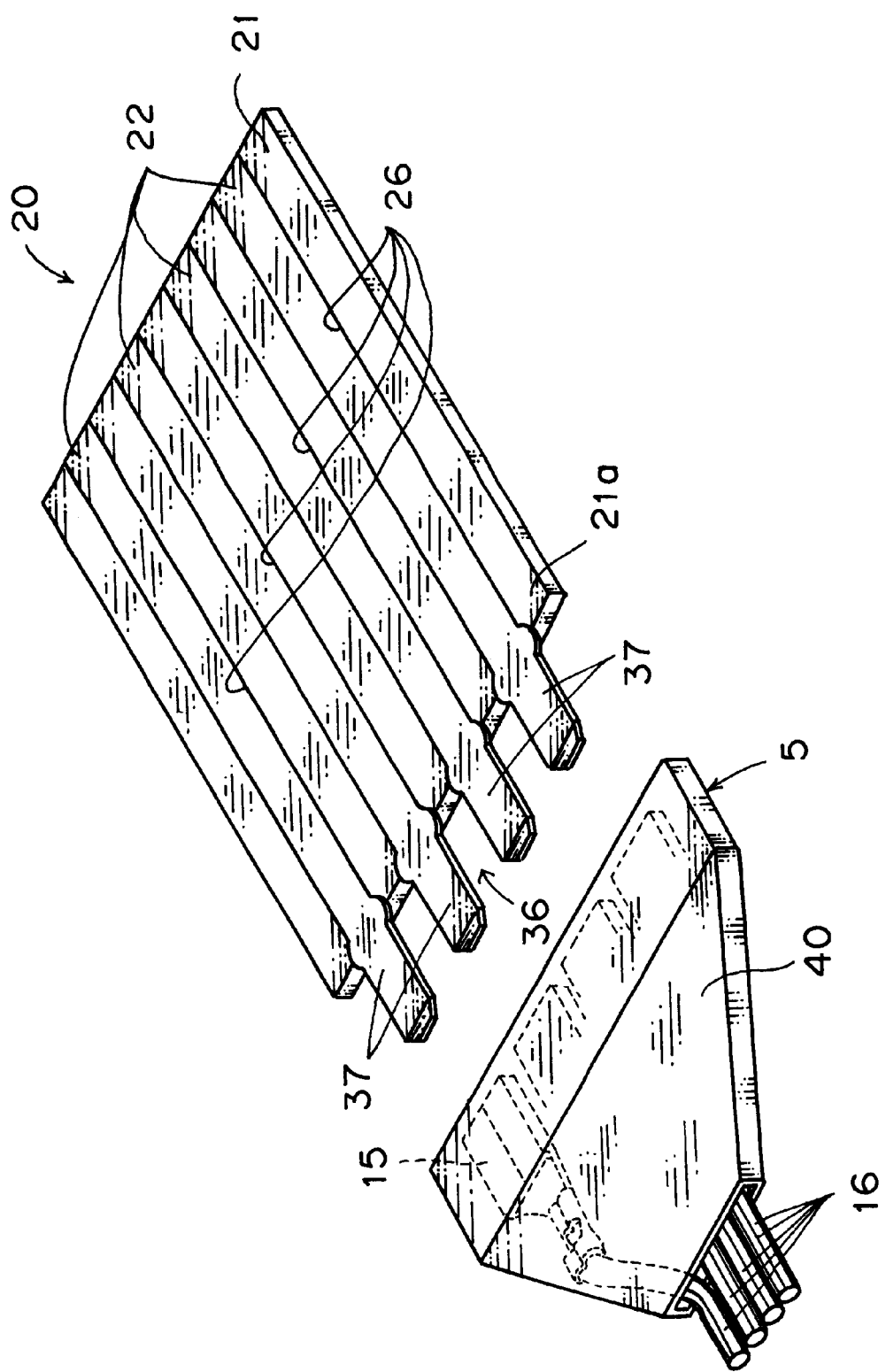
FIG. 4 is a perspective view of a connector receiving portion in the embodiment of this invention.
Figure 6:
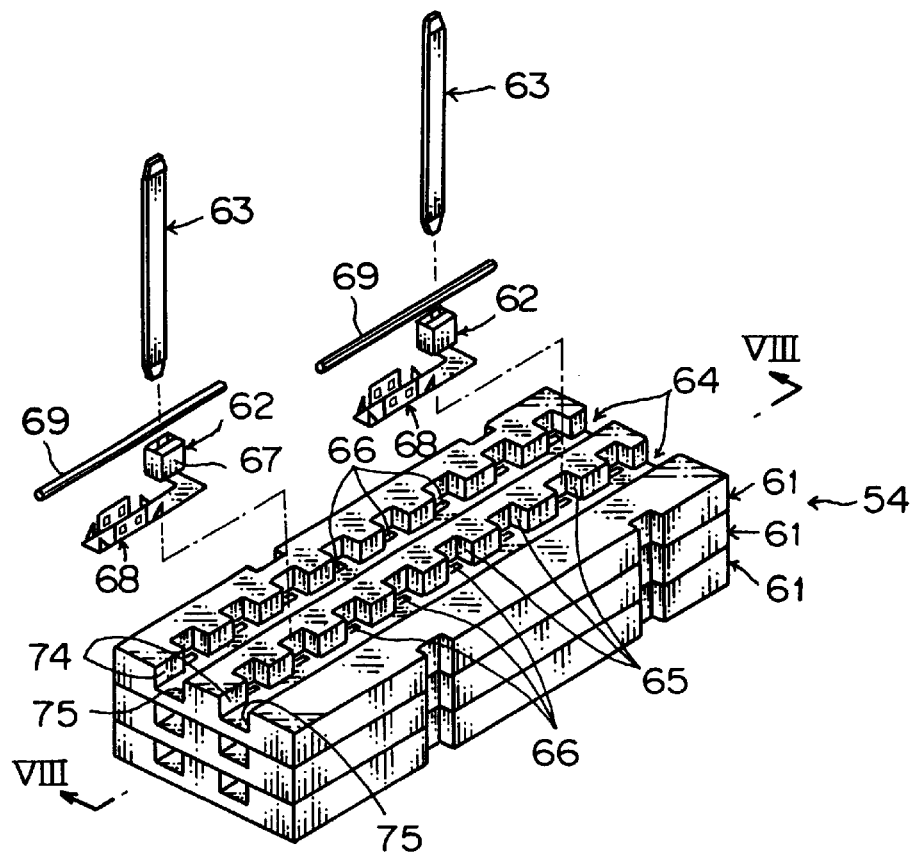
FIG. 6 is a perspective view of a conventional wiring unit.
Figure 7:
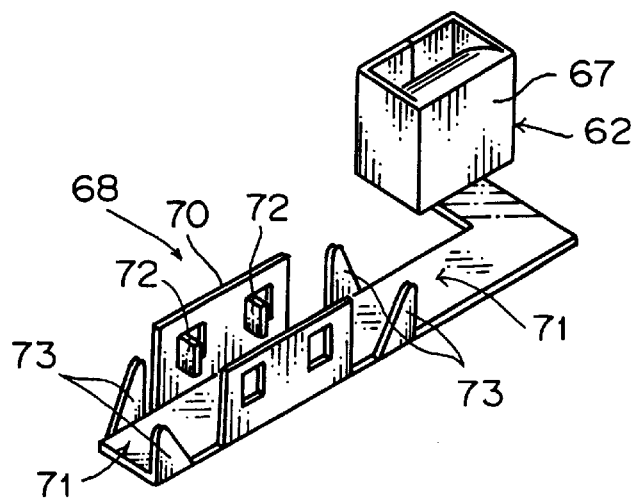
FIG. 7 is a perspective view of a terminal of the wiring unit shown in FIG. 6.

As seen from FIGS. 1 and 4, the wiring unit 1 includes a plurality of plates 21 which are successively stacked, a plurality of bus bars 22 and a plurality of short-circuiting members 23. The plates 21 each is made of e.g. insulating synthetic resin (hereinafter, these plates are referred to as insulating plates). The insulating plates 21 each is formed as a square flat insulating plate. The insulating plates 21 each includes a plurality of bus bar positioning grooves 26 which are concaved from the surface of itself.

The bus bar positioning grooves 26 are formed in a longitudinal direction of the insulating plate 21, and arranged in parallel at regular intervals in a width direction of the insulating plate 21. In the example shown in FIGS. 1 and 4, four bus bar positioning grooves 26 are formed in the surface of the insulating plate 21.

The bus bars 22 each is made of an electrically conductive material such as metal. The bus bars 22 each is formed in a belt shape extended in a direction. The bus bars 22, which are fit in the bus bar positioning grooves 26, respectively, are placed on the insulating plate 21. The insulating plate 21 and bus bar 22 constitute a flat circuit body defined in claims. The bus bar 22 is referred to as a conductor in claims.

The plurality of short-circuiting members 23 each is made of a conductive material such as metal. As seen from FIG. 2, the short-circuiting member 23 is formed in a ⊐-shape integrally composed of a pair of pin segments 24 and a coupling section which couples the ends of the pin segments. The short-circuiting member 23 is coated with an insulating film over the pin segments 24 and coupling segment 23. This insulating film can be peeled from the body of the short-circuiting member 23.

The interval D (FIG. 2) between the pin segments 24 of the short-circuiting member 23 is set for a distance that is longer than the interval T1 (FIG. 3) between the adjacent internal edges of the adjacent ones of the bus bars 22 arranged successively in parallel. The interval D is also set for a distance that is shorter than the outer edges of the adjacent bus bars 22.

At least one of a plurality of flat circuit bodies 20 which are successively stacked has a connector receiving portion 36. In the example, all the insulating plates 21 each has the connector receiving portion 36, respectively.

The connector receiving portion 36 has a plurality of male tabs 37 each of which protrudes outwardly from the end 21a of the insulating plate 21. The end 21a is defined as the end of the flat circuit body 20 defined in claims. Four male tabs 37 are illustrated. These male tabs 37 are electrically connected to terminals 15 of the connector unit 5, respectively. In FIG. 1, only the connector unit 5 connected to the connector receiving portion 36 at the lower most position is shown.

As seen from FIG. 4, the connector unit 5 includes a housing 40 and a plurality of terminals 15. The housing 40 is made of an insulating material such as synthetic resin. The terminals 15 are electrically connected to the male tabs 37, respectively.

The terminals 15 are housed within the housing 40, and communicated with electric wires 16. These electric wires 16 are electrically connected to various external electric appliances such as lamps, motors and the batteries. The electric wires 16 are tied up in a bundle.

The connector unit 5 is connected to the connector receiving portion 36 in such a fashion that the terminals 15 are connected to the male tabs 37. The connector unit 5 as well as the insulating plate 21 is housed within the case such as the electric connecting box while it is connecter-coupled with the connector receiving portion 22.

In the wiring unit 1 described above, a plurality of layers of the insulating plates 21 on each of which the plurality of bus bars are arranged are successively stacked, and the pin segments 24 are stuck into prescribed bus bars 22 which must be electrically connected to each other. Incidentally, the insulating film is removed from the locations R1 and R2 of the pin segments 24 in FIG. 2 which are to be brought into contact with the bus bars 22 which must be electrically connected to each other.

In the embodiment of this invention, the bus bars 22 which are arranged on the different insulating plates 21 and in parallel are electrically connected to each other. In the embodiment, the bus bars 22 which are arranged on the different insulating plates 21 and superposed on each other are electrically insulated from each other. However, in case of necessity, the insulating film may be removed so that the bus bars 22 superposed on each other are electrically connected to each other.

Further, the connector unit 5 is connecter-coupled with the connector receiving portion 36 so that the external appliance such as the electric appliances are electrically connected to the electric components previously described using the bus bars in accordance with a prescribed pattern.

In accordance with this embodiment, by selecting the bus bars 22 into which the pin segments 24 of the short-circuit member 23 are stuck, the desired bus bars 22 can be electrically connected to each other surely in accordance with a prescribed pattern.

In this way, the simple configuration of sticking the pin segments 24 of the short-circuiting member 23 can assure a desired electric connection. This permits the number of man-hours for production of the components and for assembling, thereby suppressing rise in cost.

Further, the short-circuiting member 23 has a pair of pin segments 24 so that the bus bars 22 arranged in parallel can be electrically connected to each other surely. This suppresses the limitation to the circuit design of the wiring unit 1 and miniaturizes it.

By selecting the locations of the pin segments 24 from which the insulating film should be removed, electric connection or insulation can be made between the bus bars superposed on each other. This further suppresses the limitation to the circuit design.

Since the interval D is set to be larger than the interval T1 and smaller than the interval T2, the bus bars 22 adjacent to each other can be electrically connected to each other by the short-circuiting member 23 in accordance with the prescribed pattern.

Further, the bus bar 22 protrudes from the end 21a of at least one flat circuit body 20 to provide the male tabs 37 and the male tabs 37 can be connected to the terminals 15 electrically connected to the external appliances, i.e. the electric wires 16. For this reason, an electric connection can be surely made between the bus bars 22 connected to each other and the external appliance in accordance with a desired pattern.

In this embodiment, all the flat circuit bodies 20 each is provided with the connector receiving portion 36. However, as necessary, the connector receiving portion 36 can be provided for any one of the flat circuit bodies 20 which are successively stacked.

Figure 5:
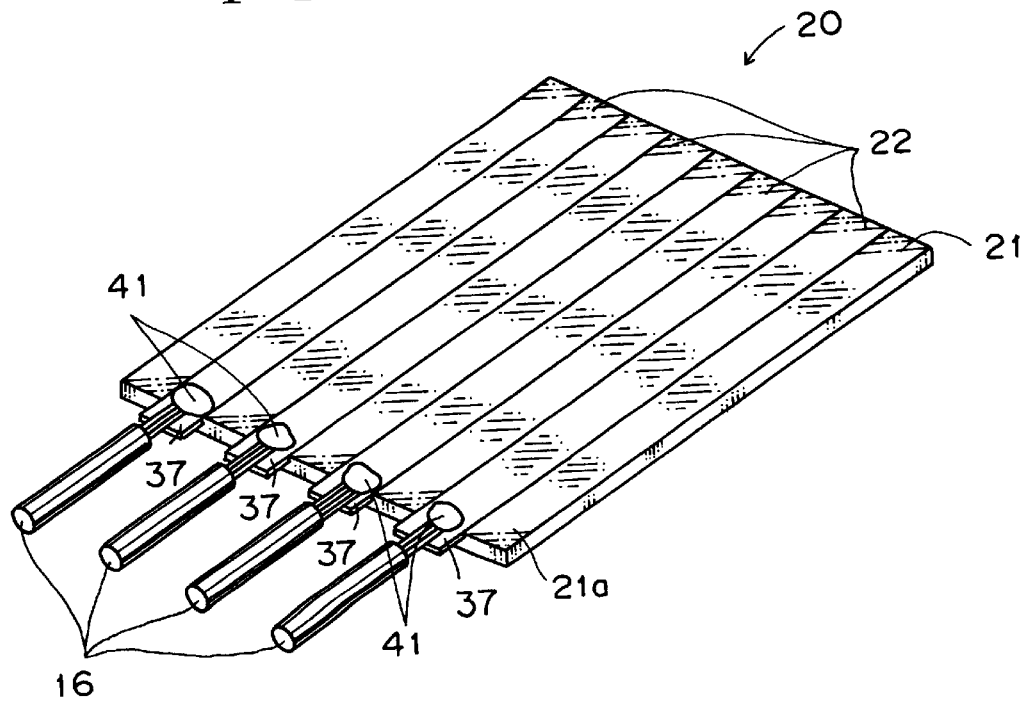
FIG. 5 is, a perspective view of a modification of a connecting state of a bus bar and an electric wire.
Figure 2:
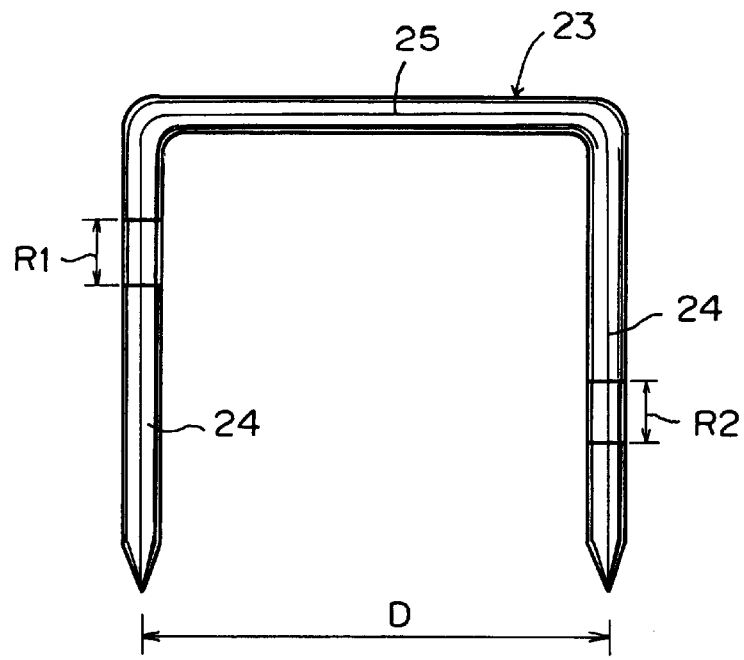
FIG. 2 is a plan view of a short-circuiting member of the wiring unit according to the embodiment of this invention.
Figure 3:
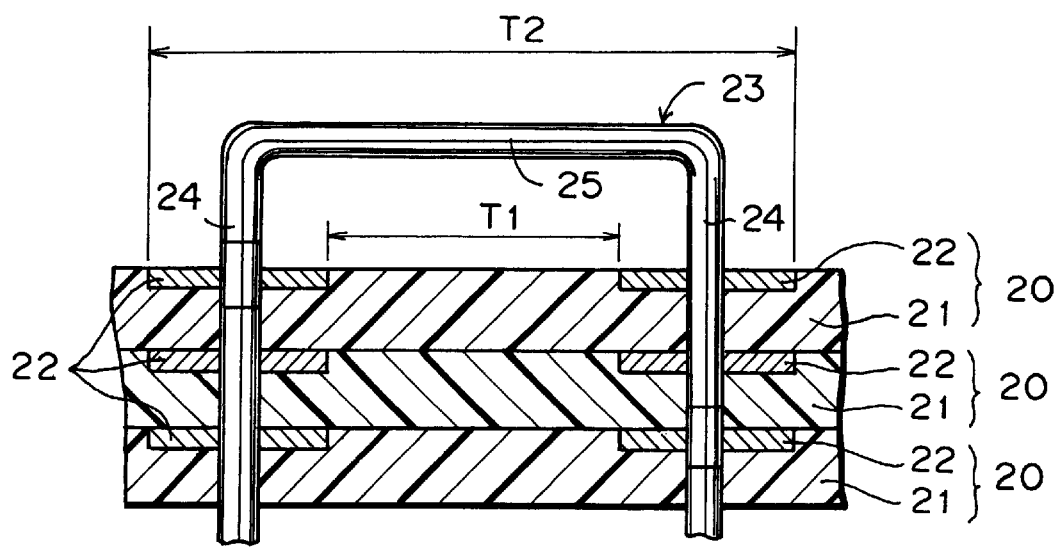
FIG. 3 is a sectional view taken in line III—III in FIG. 1.

In this embodiment, the electric wires 16 electrically connected to the external appliance are connected to the male tabs 37 via the terminals 15 the connector unit 5. However, as seen from FIG. 5, the electric wires 16 may be connected to the male tabs 37 with the aid of brazing of solder 41.

In this embodiment, the flat circuit body 20 is constructed of the insulating plate 21 and bus bars 22. However, the flat circuit body 20 maybe a conventionally known flexible printed circuit (FPC) or flexible flat cable (FFC) which is composed of a plurality of belt conductors and an insulating layer covering them.

What is claimed is:

1. A wiring unit comprising:
    a plurality of flat circuit bodies each composed of an insulating plate and a plurality of conductors arranged there on in parallel in a direction thereof, the circuit bodies being stacked successively vertically; and
    a short-circuiting member composed of a plurality of pin segments and a coupling segment for electrically coupling the plurality of pin segments with each other, the short-circuiting member being made of a conductive material and covered with an insulating film on its surface, wherein
    the pin segments with the insulating film partially removed are stuck into the flat circuit bodies so that the conductors are electrically connected to each other.

2. The wiring unit according to claim 1, wherein the short-circuiting member is formed in a ⊐-shape with a pair of pin segments, and the interval between the pin segments is smaller than that between inner edges of the conductors adjacent to each other and larger than that between outer edge of the conductors adjacent to each other.

3. The wiring unit according to claim 1, wherein at least one of the conductors of at least one of the flat circuit bodies protrudes from its end to form a male tab which can be connected to an electric wire electrically connected to an external appliance.

4. The wiring unit according to claim 2, wherein at least one of the conductors of at least one of the flat circuit bodies protrudes from its end to form a male tab which can be connected to an electric wire electrically connected to an external appliance.

* * * * *